(12) United States Patent
Hsueh et al.

(10) Patent No.: US 9,537,089 B2
(45) Date of Patent: Jan. 3, 2017

(54) METHOD AND DEVICE FOR HUGE MAGNETORESISTANCE IN GRAPHENE-BASED MAGNETIC TUNNEL JUNCTIONS WITH SEGMENTED POTENTIALS

(71) Applicant: NATIONAL TAIWAN UNIVERSITY, Taipei (TW)

(72) Inventors: Wen-Jeng Hsueh, Taipei (TW); Chang-Hung Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/887,421

(22) Filed: Oct. 20, 2015

(65) Prior Publication Data

US 2016/0111633 A1 Apr. 21, 2016

Related U.S. Application Data

(60) Provisional application No. 62/065,804, filed on Oct. 20, 2014.

(51) Int. Cl.
| | |
|---|---|
| *H01L 43/10* | (2006.01) |
| *H01L 43/02* | (2006.01) |
| *H01L 43/12* | (2006.01) |

(52) U.S. Cl.
CPC ............... *H01L 43/10* (2013.01); *H01L 43/02* (2013.01); *H01L 43/12* (2013.01)

(58) Field of Classification Search
CPC ........... H01L 43/02; H01L 43/10; H01L 43/12
See application file for complete search history.

(56) References Cited

U.S. PATENT DOCUMENTS

| 7,863,700 | B2 * | 1/2011 | Kreupl | ................... | B82Y 10/00 257/421 |
|---|---|---|---|---|---|
| 8,294,132 | B2 * | 10/2012 | Miao | ...................... | H01L 45/08 257/1 |
| 2012/0074510 | A1 * | 3/2012 | Sasaki | .................. | G01R 33/093 257/422 |
| 2012/0211848 | A1 * | 8/2012 | Sasaki | ..................... | H01L 43/08 257/422 |
| 2014/0056060 | A1 * | 2/2014 | Khvalkovskiy | ....... | H01L 27/228 365/158 |
| 2014/0160835 | A1 * | 6/2014 | Soree | ...................... | H01L 43/02 365/158 |
| 2015/0255710 | A1 * | 9/2015 | Nakamura | .............. | H01L 43/08 365/158 |

* cited by examiner

*Primary Examiner* — Allan R Wilson
(74) *Attorney, Agent, or Firm* — Allen, Dyer, Doppelt, Milbrath & Gilchrist, P.A.

(57) ABSTRACT

A graphene-based magnetic tunnel junction is disclosed. The magnetic tunnel junction can enhance the tunnel magnetoresistance ratio and a device including the magnetic tunnel junction. The magnetic tunnel junction includes: a pinned layer; a free layer; and a graphene with segmented potentials configured between the pinned layer and the free layer. The magnetic tunnel junction may be a series or parallel connection of the above-mentioned basic form. The device including a magnetic tunnel junction may be a magnetic random access memory bit cell, a magnetic tunnel junction transistor device, a magnetic field sensor, etc.

20 Claims, 11 Drawing Sheets

METHOD AND DEVICE FOR HUGE MAGNETORESISTANCE IN GRAPHENE-BASED MAGNETIC TUNNEL JUNCTIONS WITH SEGMENTED POTENTIALS

CROSS-REFERENCE TO RELATED APPLICATION AND CLAIM OF PRIORITY

This application claims the benefit of U.S. Provisional Application No. 62/065,804, filed on Oct. 20, 2014, in the United States Patent and Trademark Office, the disclosures of which are incorporated herein in their entirety by reference.

FIELD OF THE INVENTION

The invention relates to a magnetic tunnel junction (MTJ), and more particularly to a graphene-based MTJ for use in magnetic random access memories, transistor devices and magnetic field sensors.

BACKGROUND OF THE INVENTION

Graphene has attracted much interest due to the possibility of graphene-based devices that may have better performance, such as speed and power consumption, than their semiconductor counterparts. This is expected because of the unique properties of graphene such as the high mobility of carriers, which gives high current densities. Moreover, graphene is expected to be suitable for spintronics due to the long spin relaxation lengths and the weak spin-orbit interaction. Graphene nanoribbons (GNRs) with designed edges offer methods to manipulate spin-polarized electrons. Spin valves are the most popular device in spintronics. Graphene-based spin valves have been experimentally demonstrated.

A typical magnetic tunnel junction has a sandwich structure F/I/F, where F indicates a ferromagnet and I indicates an insulating barrier. Currently, the mainstream structure of the insulating barrier is a single insulator material. The structure above is called a single-barrier structure, and the tunnel magnetoresistance (TMR) ratio can reach about $10^2$%. Recently, double-barrier structures (e.g. F/I/F/I/F or F/I/N/I/F, where N is a metal) were proposed. The TMR ratio of a double-barrier structure can reach about $10^3$%. The barrier segment of a magnetic tunnel junction must be thin enough to allow the tunnel effect in quantum mechanics.

A magnetic tunnel junction is an important component when designing hard disk read heads and magnetic random access memories, while the TMR ratio is an important indicator to assess the magnetic tunnel junction. For example, a magnetic tunnel junction with a higher TMR ratio can enhance the sensitivity of the hard disk read head, and thereby enhance the capacity of the hard disk. Another example is the magnetic field sensor. At present, the most sensitive magnetic field sensor is the superconducting quantum interference device (SQUID). However, the SQUID must operate at very low temperatures, and thus liquid nitrogen is needed. Through improving the sensitivity of the MTJ, we have the opportunity to obtain a magnetic field sensor which is as sensitive as the SQUID and has the advantage of working at room temperature.

Another structure similar to the magnetic tunnel junction is the giant magnetoresistance (GMR) structure. The GMR structure does not have a barrier, and thus no tunnel effect is involved. The typical material of its middle layer is a conductor. The GMR structure has a similar indicator: the magnetoresistance ratio. The magnetoresistance ratio of a GMR structure can reach about $10^2$%.

After the magnetic tunnel junction was invented in 1995, it has been an important issue to design a magnetic tunnel junction with a higher TMR ratio. The goal of the present invention is to provide a magnetic tunnel junction with high TMR ratio.

In order to overcome the drawbacks in the prior art, a graphene-based magnetic tunnel junction with segmented potentials is disclosed. The particular design in the present invention not only solves the problems described above, but is also easy to implement. Thus, the present invention has utility for the industry.

SUMMARY OF THE INVENTION

The new technique proposed in the present invention utilizes a graphene-based magnetic tunnel junction with segmented potentials to replace the traditional single-barrier and double-barrier ones. The TMR ratio of the graphene-based magnetic tunnel junction with segmented potentials can be enhanced to reach $10^7$%.

In accordance with an aspect of the present invention, a magnetic tunnel junction (MTJ) is disclosed. The MTJ includes: a pinned layer; a free layer; and a periodic graphene nanoribbon layer having a plurality of segmented units, and disposed between the pinned layer and the free layer, wherein each of the plurality of segmented units includes at least one first segment and at least one second segment having a potential difference therebetween.

In accordance with a further aspect of the present invention, a magnetic tunnel junction (MTJ) is disclosed. The MTJ includes: a pinned layer; a free layer; and a first graphene layer having a plurality of segmented potentials and disposed between the pinned layer and the free layer.

In accordance with another aspect of the present invention, a method for forming a magnetic tunnel junction is disclosed. The method includes steps of: providing a pinned layer; providing a free layer; and providing a graphene having a plurality of segmented potentials between the pinned layer and the free layer.

The present invention discloses a graphene-based magnetic tunnel junction with a high TMR ratio, enhanced to reach $10^7$%, and a method for forming the magnetic tunnel junction with a high TMR ratio. The magnetic tunnel junction with a high TMR ratio can be used in hard disk read heads, magnetic random access memories, magnetic field sensors, etc. and greatly enhances their performance. Thus, the present invention has significant practical applications.

The aspects and advantages of the present invention will become more readily apparent to those ordinarily skilled in the art after reviewing the following detailed descriptions and accompanying drawings.

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; they are not intended to be exhaustive or to be limited to the precise form disclosed.

While the present invention is described with reference to the preferred embodiments and examples, it is to be understood that these examples are intended to be illustrative rather than in a limiting sense. It is contemplated that modifications and combinations will readily occur to those skilled in the art, and these modifications and combinations are within the spirit of this invention.

In addition, the present invention can be fully understood from the descriptions of the following embodiments, allowing persons skilled in the art to carry it out accordingly, but the following embodiments of the invention are set forth without any loss of generality to and without imposing limitations upon the claimed invention. The same reference numerals are used to denote the same components throughout.

Figure 1A:
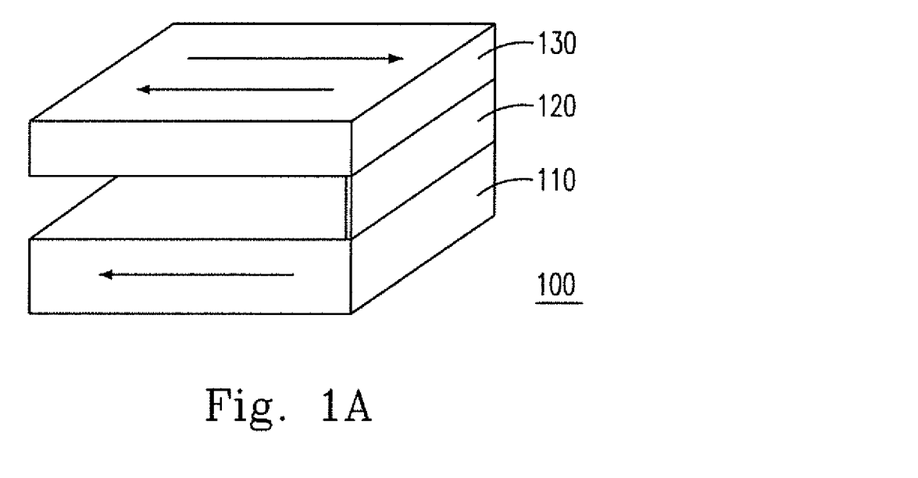
FIG. 1A and FIG. 1B show an embodiment of the basic form of the magnetic tunnel junction of the present invention.
Figure 1B:
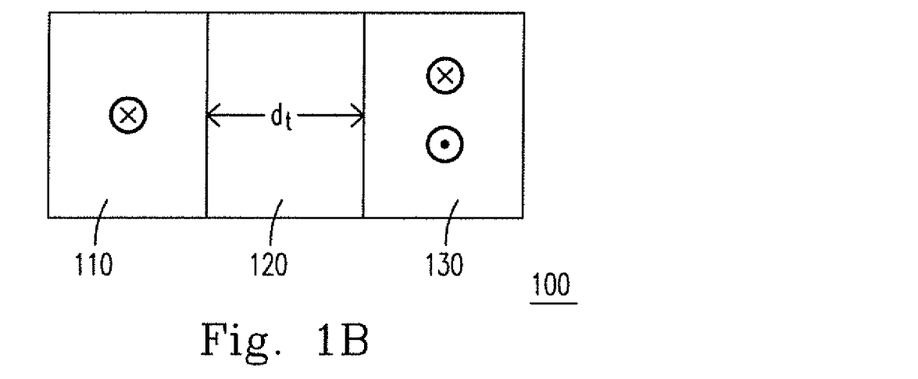
Figure 2A:
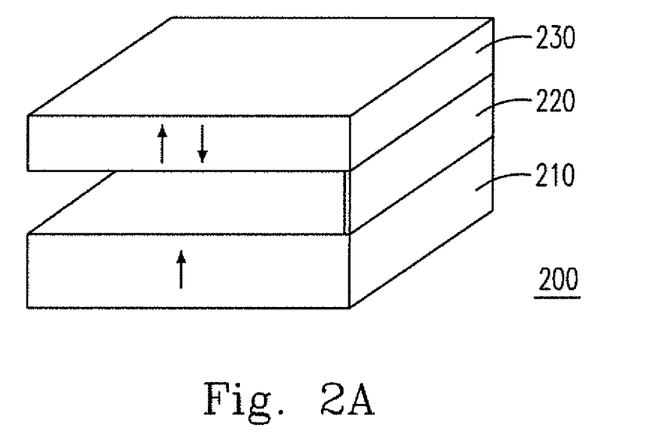
FIG. 2A and FIG. 2B show another embodiment of the basic form of the magnetic tunnel junction of the present invention.
Figure 2B:
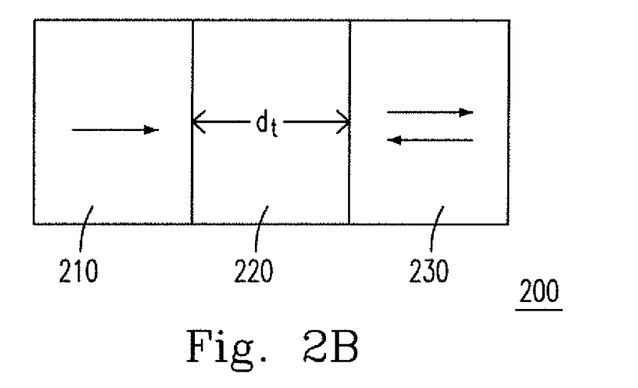

Please refer to FIG. 1A, FIG. 1B, FIG. 2A and FIG. 2B, which show two embodiments of the basic form of the magnetic tunnel junction of the present invention. FIG. 1A shows, not drawn to scale, a magnetic tunnel junction 100, the magnetic tunnel junction 100 including: a pinned layer 110, a graphene with segmented potentials 120 and a free layer 130. Because graphene, an atomic-scale honeycomb lattice, is virtually two-dimensional, the graphene with segmented potentials 120 in FIG. 1A is shown as a thin layer laterally connected to the pinned layer 110 and the free layer 130. In other words, the plane of the thin layer 120 is basically perpendicular to the planes of the pinned layer 110 and the free layer 130. The pinned layer 110 has a first magnetization direction (shown by the arrow on the pinned layer 110). The first magnetization direction extends along a line on the plane of the pinned layer 110, and the magnetization direction of the free layer 130 is either the same as or opposite to the first magnetization direction (as shown by the arrows on the free layer 130). From the point of view of the graphene with segmented potentials 120, and thus the point of view of the MTJ of the present invention, the first magnetization direction extends vertically. FIG. 1B is a 90°-rotated side view, which is not drawn to scale, of the magnetic tunnel junction 100. FIG. 1B also shows the total thickness $d_t$ of the graphene with segmented potentials 120 between the pinned layer 110 and the free layer 130. The term "thickness" follows that of a conventional MTJ in which the middle barrier layer is a three-dimensional layer and the plane of the barrier layer is basically parallel to the planes of the pinned layer and the free layer, and thus the barrier layer having a "thickness" between the pinned layer and the free layer. FIG. 2A shows a magnetic tunnel junction 200. The magnetic tunnel junction 200 includes: a pinned layer 210, a graphene with segmented potentials 220 and a free layer 230. The pinned layer 210 has a second magnetization direction perpendicular to the plane of the pinned layer 210 (as shown by the arrow on the pinned layer 210), and the magnetization direction of the free layer 230 is either the same as or opposite to the second magnetization direction (as shown by the arrows on the free layer 230). From the point of view of the graphene with segmented potentials 120, and thus the point of view of the MTJ of the present invention, the second magnetization direction extends laterally. FIG. 2B is a 90°-rotated side view, which is not drawn to scale, of the magnetic tunnel junction 200.

Figure 3:
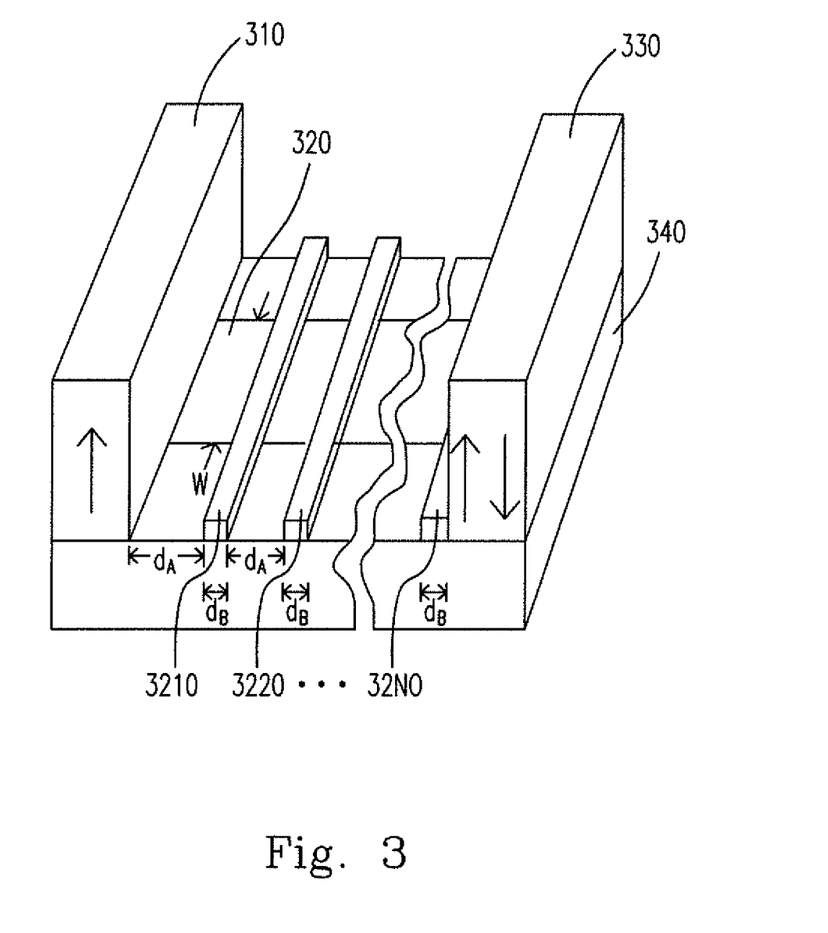
FIG. 3 is a stereo view of another embodiment of the magnetic tunnel junction of the present invention.

FIG. 3 is a stereo view of another embodiment of the magnetic tunnel junction of the present invention, where the graphene with segmented potentials 320 is exaggerated to show the details. In FIG. 3, the magnetization directions of the pinned layer 310 and the free layer 330 extend vertically. The magnetization directions of the pinned layer and the free layer can also extend laterally. In FIG. 3 the magnetic tunnel junction is disposed on a substrate 340. The substrate 340 is not part of the magnetic tunnel junction, and there can be other arrangements. Preferably, the graphene with segmented potentials 320 is an armchair graphene nanoribbon. The width of the graphene with segmented potentials 320 is W. In FIG. 3, N electrodes 3210, 3220, . . . and 32N0 are used to create periodic potentials. The graphene with segmented potentials 320 can be expressed as $(A/B)^N$, where A and B have different thicknesses and barrier heights. In other words, the graphene with segmented potentials 320 has N cells (A/B). In each cell, A has is a thickness $d_A$ and B has a thickness $d_B$. Hence $(d_A+d_B)*N=d_t$. Methods other than providing electrodes can be utilized as long as periodic potentials are created.

Figure 4:
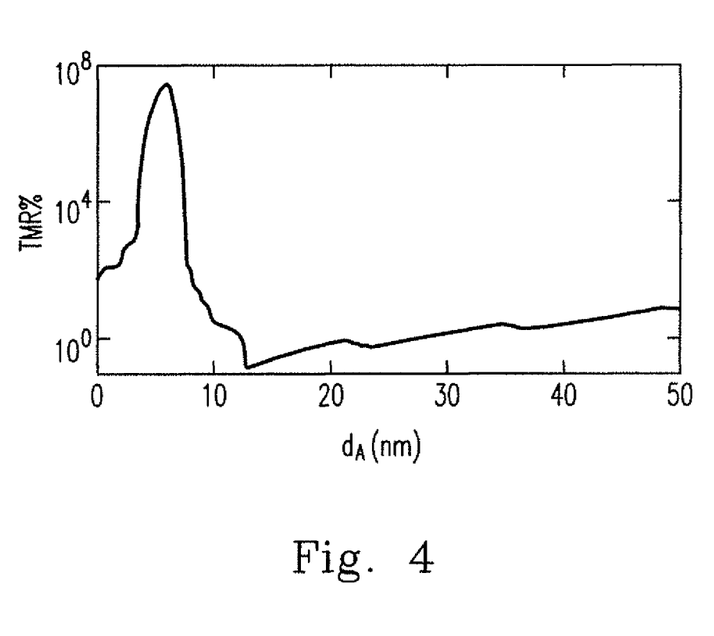
FIG. 4 shows the calculated tunnel magnetoresistance ratio (TMR %) of the magnetic tunnel junction of FIG. 3 for N=6 as a function of the thickness $d_4$.

FIG. 4 shows the calculated tunnel magnetoresistance ratio (TMR %) of the magnetic tunnel junction (MTJ) of FIG. 3 for N=6 as a function of the thickness $d_A$. In the calculation, the width W of the graphene with segmented potentials 320 is 9.8 nm, and the thickness $d_B$ of B is 16 nm. It is seen in FIG. 4 that TMR % $3 \times 10^7$% when $d_A$=5 nm.

Preferably, the pinned layer is a second graphene layer including thereon a first ferromagnetic material, the free layer is a third graphene layer including thereon a second ferromagnetic material, and the second graphene layer and the third graphene layer are integrally formed with the first graphene layer. Examples of the ferromagnetic materials are EuO, NiFe, NiFeCo, CoFe, CoFeB, Fe, Co, Ni, Mn, In, As, Ga, InAs, GaAs, GaMnAs, InMnAs, or an alloy or compound of the above. The ferromagnetic material can induce magnetism in graphene. The magnetization direction of the induced magnetism is the same as that of the ferromagnetic material. Therefore, the graphene including thereon the ferromagnetic material can be defined as either the pinned layer or the free layer.

In general, the graphene with segmented potentials includes at least two multi-segment cells. For example, the structure of the graphene with segmented potentials 320 in FIG. 3 is [Well/Barrier]$^N$, where "Well" denotes a well segment with a relatively lower potential, "Barrier" denotes a barrier segment (not to be confused with the graphene with segmented potentials 320 which as a whole is a barrier for the MTJ) with a relatively higher potential, and [Well/Barrier] is a multi-segment cell (there are two segments inside the multi-segment cell: a well segment and a barrier segment). The graphene with segmented potentials 320 in the MIT whose TMR % is shown in FIG. 4 consists of six multi-segment cells. Each of the at least two multi-segment cells includes at least one barrier segment and at least one potential well segment, alternately connected to each other, wherein the barrier segment is a graphene with higher potential, and the well segment is the graphene with lower potential. Again, take the graphene with segmented potentials 320 in the MIT whose TMR % is shown in FIG. 4 as an example. Each of the six multi-segment cells has a barrier segment and a potential well segment.

The magnetic tunnel junction may include one or more buffer layers. The buffer layer is disposed in a position being one selected from a group consisting of being located between the first graphene layer and the pinned layer, between the first graphene layer and the free layer, and between the at least two cells.

Figure 5:
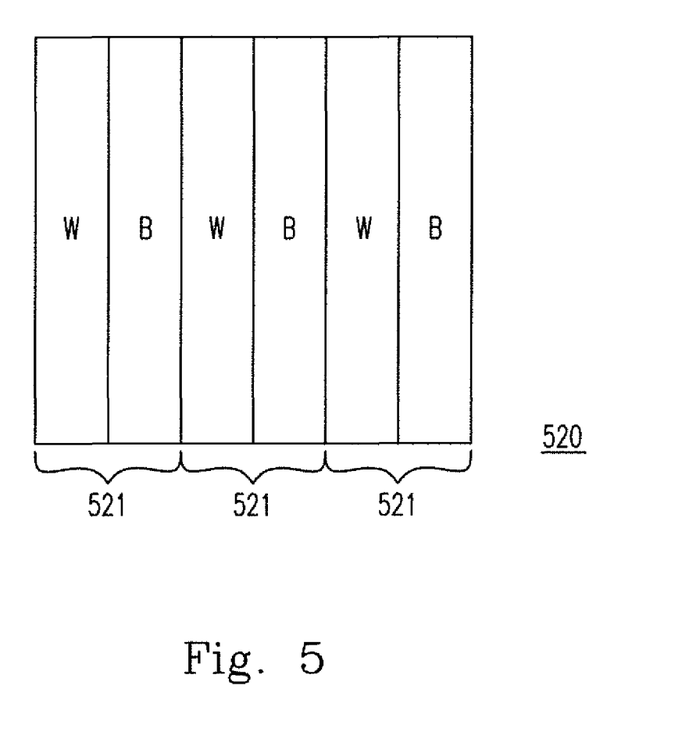
FIG. 5 shows an example of the graphene with segmented potentials.

Two more embodiments of the graphene with segmented potentials are disclosed to help the readers understand a few possible configurations of the at least one barrier segment and at least one potential well segment in the at least two multi-segment cells. Then, the readers can construct other possible configurations. First, please refer to FIG. 5. The graphene with segmented potentials 520 consists of three multi-segment cells 521 laterally connected to form a periodic structure. Each of the multi-segment cells 521 consists of a well segment W and a laterally connected barrier segment B.

Figure 6:
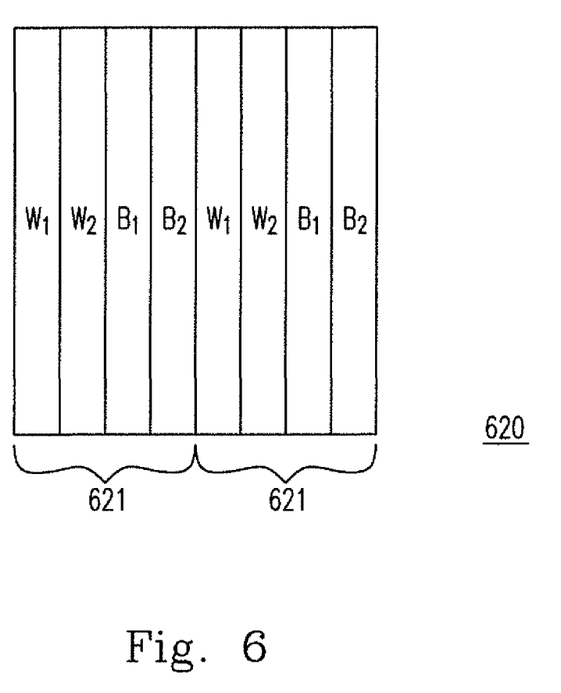
FIG. 6 shows another example of the graphene with segmented potentials.

Second, please refer to FIG. 6, which shows another example of the graphene with segmented potentials. The graphene with segmented potentials 620 consists of two multi-segment cells 621 laterally connected to form a periodic structure. Each of the multi-segment cells 621 consists of a first well segment $W_1$, a second well segment $W_2$, a first barrier segment $B_1$ and a laterally connected second barrier segment $B_2$. Other configurations can easily be constructed.

Figure 7:
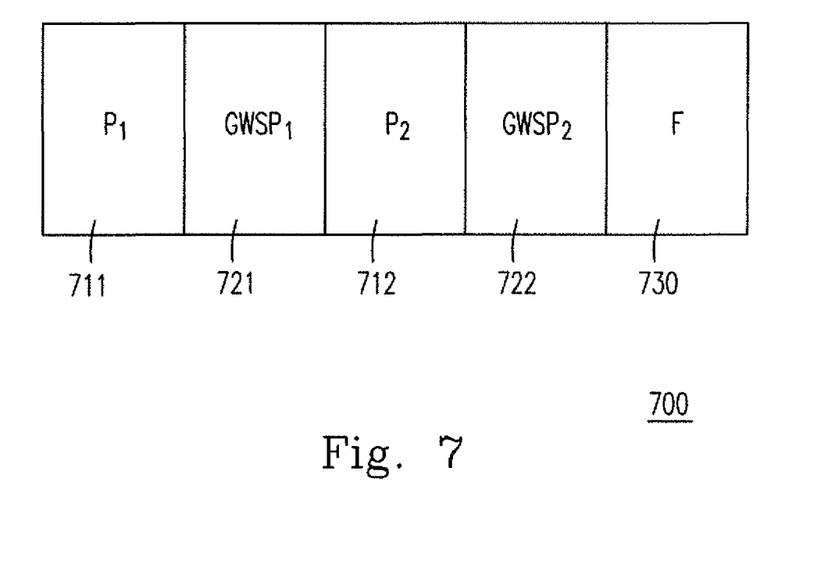
FIG. 7 shows another embodiment of the magnetic tunnel junction of the present invention.

Please refer to FIG. 7, which shows another embodiment of the magnetic tunnel junction of the present invention. The magnetic tunnel junction 700 includes, in the lateral direction, a first pinned layer 711, a laterally connected first graphene with segmented potentials 721, a second pinned layer 712 and a second laterally connected graphene with segmented potentials 722. On the right side (which can be called the outer side) of the rightmost (or, outermost) graphene with segmented potentials 722, there is a free layer 730. This embodiment can be seen as a series connection of the basic form of the magnetic tunnel junction of the present invention. In general, there can be a series connection of magnetic tunnel junctions, and thus the series connection having a plurality of barriers and a plurality of pinned layers. The plurality of barriers are alternately connected in pairs with the plurality of pinned layers. The number of such pairs may be greater than 2. All the possible series connections are variations of this embodiment, as long as one of the barriers in the series connection is a graphene with segmented potentials.

Figure 8:
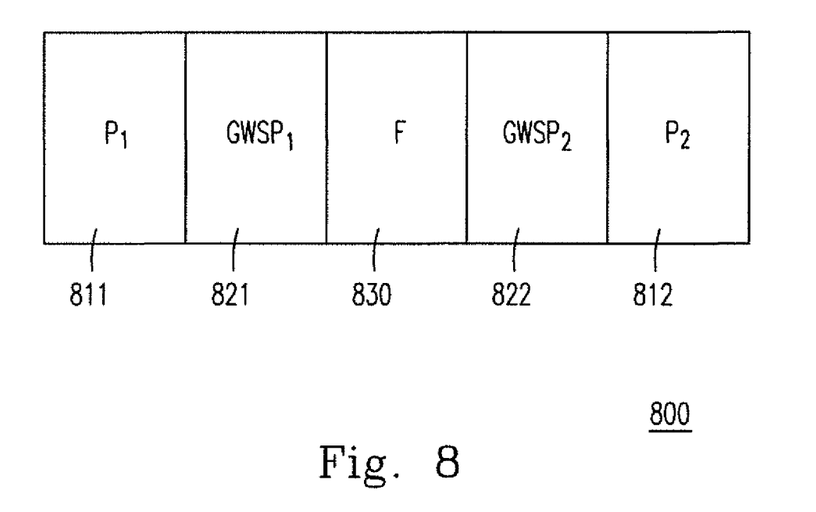
FIG. 8 shows another embodiment of the magnetic tunnel junction of the present invention.

Please refer to FIG. 8, which shows another embodiment of the magnetic tunnel junction of the present invention. The magnetic tunnel junction 800 includes a first pinned layer 811, a laterally connected first graphene with segmented potentials 821, a free layer 830, laterally connected second graphene with segmented potentials 822 and a second pinned layer 812 in the lateral direction. This embodiment can be seen as the parallel connection of the basic form of the magnetic tunnel junction of the present invention and may have many variations. In general, there can be a combination of series and parallel connections of magnetic tunnel junctions, and thus the combination of series and parallel connections have a plurality of barriers. All the possible combinations are variations of this invention, as long as one of the barriers is a graphene with segmented potentials.

Figure 9:
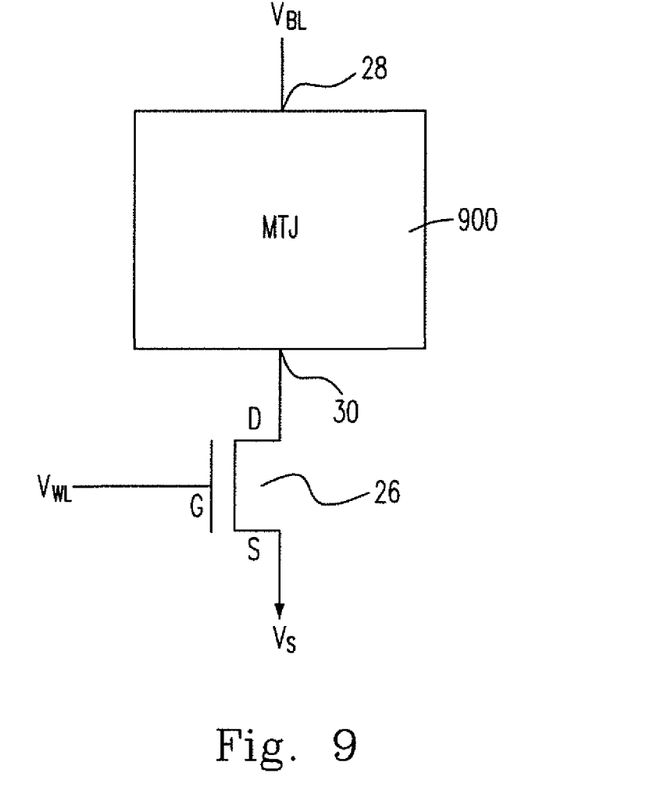
FIG. 9 shows an embodiment of the magnetic random access memory bit cell including the magnetic tunnel junction of the present invention.

Please refer to FIG. 9, which shows an embodiment of the magnetic random access memory bit cell including the magnetic tunnel junction of the present invention. Please note that, in FIG. 9, the direction of the magnetic tunnel junction 900 is rotated 90° from the direction of the magnetic tunnel junctions in FIG. 1B, FIG. 2B, FIGS. 5-6 and FIGS. 7-8. In FIG. 9, the source S of transistor 26 is coupled to a voltage source $V_S$. The drain D of transistor 26 can be coupled to the pinned layer of the magnetic tunnel junction 900 through a bottom electrode 30, while a bit line $V_{BL}$ is coupled to the free layer of the magnetic tunnel junction 900 through a top electrode 28. When reading the data stored in the magnetic tunnel junction 900, the bit line $V_{BL}$ is activated to allow current to flow through the magnetic tunnel junction 900. A small resistance value is measured when the magnetization directions of the free layer and the pinned layer are the same (called "parallel", and a memory state, e.g., a logical "0," is thus formed.). The measured resistance is the voltage applied to the bit line $V_{BL}$ divided by a measured current. When the magnetizations of the free layer and the pinned layer of the magnetic tunnel junction 900 are in opposite directions (called "anti-parallel", another memory state, e.g., a logical "1," is thus formed.), a higher resistance is measured. In other words, the magnetic random access memory utilizes the difference in magnetoresistance values between parallel and anti-parallel states to store digital logical 0 and logical 1. The magnetic tunnel junction of the present invention can substantially increase the difference in magnetoresistance values, represented by TMR %. When writing data to the magnetic tunnel junction 900, the gate G of transistor 26 is activated by activating the write line $V_{WL}$. There is a voltage differential between the bit line $V_{BL}$ and $V_S$. The voltage differential results in a write current between the drain D and the source S. To change the magnetization directions from anti-parallel to parallel, a write current flowing from the free layer to the pinned layer has to be generated. A spin transfer torque (STT) at the free layer is thus induced to change the magnetization direction of the free layer from anti-parallel to parallel. To change the magnetization direction from parallel to anti-parallel, a write current flowing from the pinned layer to the free layer has to be generated. A spin transfer torque at the free layer is thus induced to change the magnetization direction of the free layer to be anti-parallel to that of the pinned layer. The drain D of transistor 26 can also be coupled to the free layer of the magnetic tunnel junction 900, while the bit line $V_{BL}$ is coupled to the pinned layer of the magnetic tunnel junction 900. In FIG. 9 the transistor is an NMOS transistor. However, transistors of other types can also be used in the design. The magnetic tunnel junction 900 can be any of the magnetic tunnel junctions of the present invention.

Figure 10:
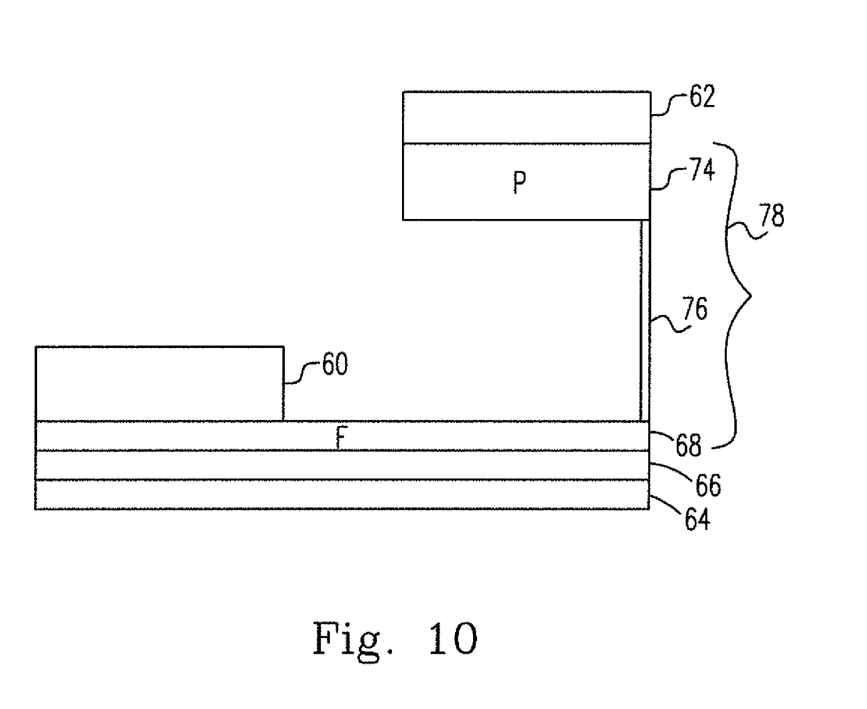
FIG. 10 shows an embodiment of the magnetic tunnel junction transistor device including the magnetic tunnel junction of the present invention.

Please refer to FIG. 10, which shows an embodiment of the magnetic tunnel junction transistor device including the magnetic tunnel junction of the present invention. FIG. 10 is a cross-sectional view of a magnetic tunnel junction transistor device, which has a first electrode 62, a gate electrode 64, and a magnetic tunnel junction 78 configured between the first electrode 62 and the gate electrode 64. In the embodiment shown in FIG. 10, between the magnetic tunnel junction 78 and the gate electrode 64, there is a gate dielectric layer 66 formed on the gate electrode 64. The first electrode 62 may be a drain or source electrode. The magnetic tunnel junction 78 includes a free layer 68 formed on top of the gate dielectric layer 66. A graphene with segmented potentials 76 is configured between the free layer 68 and a pinned layer 74. Another electrode 60 is either a source or drain electrode, different from the first electrode 62. The magnetization direction of the free layer may change with the applied voltage to the gate electrode. The magnetic tunnel junction 78 can be any of the magnetic tunnel junctions of the present invention.

Figure 11:
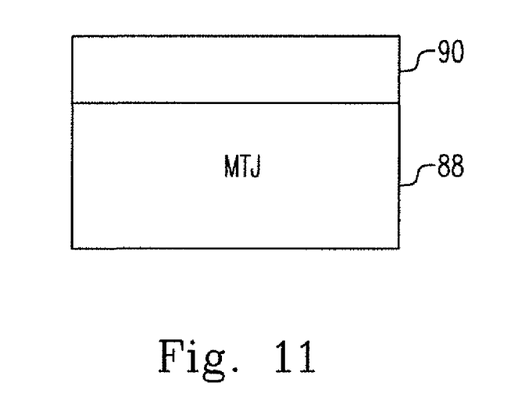
FIG. 11 shows an embodiment of the magnetic field sensor including the magnetic tunnel junction of the present invention.

Please refer to FIG. 11, which shows an embodiment of the magnetic field sensor including the magnetic tunnel junction of the present invention. In FIG. 11, due to the needs of practical design, a capped layer 90 is formed on top of the magnetic tunnel junction 88. By measuring the magnetoresistance of the magnetic tunnel junction in the magnetic field sensor, the magnitude of an external magnetic field can be obtained. There is a wide range of applications for the magnetic field sensor, e.g., biomedical sensing, biochemical sensing, wheel speed sensing, angle measurement, linear displacement measurement, current measurement, geomagnetic detection applied in compass and navigation devices, and metal detection. The magnetic tunnel junction 88 can be any of the magnetic tunnel junctions of the present invention.

There are further embodiments disclosed as follows.

Embodiment 1

A magnetic tunnel junction including a pinned layer; a free layer; and a periodic graphene nanoribbon layer having a plurality of segmented units, and disposed between the pinned layer and the free layer, wherein each of the plurality of segmented units includes at least one first segment and at least one second segment having a potential difference therebetween.

Embodiment 2

The magnetic tunnel junction according to Embodiment 1, wherein the periodic graphene nanoribbon layer is laterally connected to the pinned layer and the free layer.

Embodiment 3

The magnetic tunnel junction according to Embodiment 1 or 2, wherein the at least one first segment has a relatively higher potential, and the at least one second segment has a relatively lower potential.

Embodiment 4

The magnetic tunnel junction according to any one of Embodiments 1 to 3, wherein the pinned layer has a first magnetization direction extending vertically and the free layer has a second magnetization direction being one of the same as and opposite to the first magnetization direction.

Embodiment 5

The magnetic tunnel junction according to any one of Embodiments 1 to 4, wherein the pinned layer has a first magnetization direction extending laterally, and the free layer has a second magnetization direction being one of the same as and opposite to the first magnetization direction.

Embodiment 6

A magnetic tunnel junction, including: a pinned layer; a free layer; and a first graphene layer having a plurality of segmented potentials and disposed between the pinned layer and the free layer.

Embodiment 7

The magnetic tunnel junction according to Embodiment 6, wherein the pinned layer is a second graphene layer including thereon a first ferromagnetic material, the free layer is a third graphene layer including thereon a second ferromagnetic material, and the second graphene layer and the third graphene layer are integrally formed with the first graphene layer.

Embodiment 8

The magnetic tunnel junction according to Embodiment 6 or 7, wherein the first graphene layer is laterally connected to the pinned layer and the free layer.

Embodiment 9

The magnetic tunnel junction according to any one of Embodiments 6 to 8, wherein the first graphene layer includes at least two cells, and the at least two cells are laterally connected to each other.

Embodiment 10

The magnetic tunnel junction according to any one of Embodiments 6 to 9, wherein each of the at least two cells includes at least one first segment and at least one second segment, alternately connected to each other laterally, wherein the first segment has a relatively higher potential, and the second segment has a relatively lower potential.

Embodiment 11

The magnetic tunnel junction according to any one of Embodiments 6 to 10, wherein each of the at least two cells includes at least one first segment and at least one second segment such that when the total number of the at least one first segment and the total number of the at least one second segment are both equal to 1, the at least one first segment and the at least one second segment are laterally connected, when the total number of the at least one first segment is no less than 2, all the first segments are laterally connected, and when the total number of the at least one second segment is no less than 2, all the second segments are laterally connected.

Embodiment 12

The magnetic tunnel junction according to any one of Embodiments 6 to 11, further including a buffer layer, wherein the buffer layer is disposed in a position being one selected from a group consisting of being located between the first graphene layer and the pinned layer, between the first graphene layer and the free layer, and between the at least two cells.

Embodiment 13

The magnetic tunnel junction according to any one of Embodiments 6 to 12, wherein the pinned layer has a first magnetization direction extending vertically and the free layer has a second magnetization direction being one of the same as and opposite to the first magnetization direction.

Embodiment 14

The magnetic tunnel junction according to any one of Embodiments 6 to 13, wherein the pinned layer has a first magnetization direction extending laterally, and the free layer has a second magnetization direction being one of the same as and opposite to the first magnetization direction.

Embodiment 15

A method for forming a magnetic tunnel junction, including steps of: providing a pinned layer; providing a free layer; and providing a graphene having a plurality of segmented potentials between the pinned layer and the free layer.

Embodiment 16

The method for forming a magnetic tunnel junction according to Embodiment 15, wherein the graphene is laterally connected to the pinned layer and the free layer.

Embodiment 17

The method for forming a magnetic tunnel junction according to Embodiment 15 or 16, wherein the graphene includes at least two cells, and the at least two cells are laterally connected to each other.

Embodiment 18

The method for forming a magnetic tunnel junction according to any one of Embodiments 15 to 17, wherein each of the at least two cells includes at least one first segment and at least one second segment, alternately connected to each other laterally, wherein the first segment has a relatively higher potential, and the second segment has a relatively lower potential.

Embodiment 19

The method for forming a magnetic tunnel junction according to any one of Embodiments 15 to 18, wherein the pinned layer has a first magnetization direction extending vertically and the free layer has a second magnetization direction being one of the same as and opposite to the first magnetization direction.

Embodiment 20

The method for forming a magnetic tunnel junction according to any one of Embodiments 15 to 19, wherein the pinned layer has a first magnetization direction extending laterally, and the free layer has a second magnetization direction being one of the same as and opposite to the first magnetization direction.

While the invention has been described in terms of what is presently considered to be the most practical and preferred embodiments, it is to be understood that the invention needs not be limited to the disclosed embodiments. Therefore, it is intended to cover various modifications and similar configurations included within the spirit and scope of the appended claims, which are to be accorded with the broadest interpretation so as to encompass all such modifications and similar structures.

What is claimed is:

1. A magnetic tunnel junction, comprising:
   a pinned layer;
   a free layer; and
   a periodic graphene nanoribbon layer having a plurality of segmented units, and disposed between the pinned layer and the free layer,
   wherein each of the plurality of segmented units includes at least one first segment and at least one second segment having a potential difference therebetween.

2. The magnetic tunnel junction as claimed in claim 1, wherein the periodic graphene nanoribbon layer is laterally connected to the pinned layer and the free layer.

3. The magnetic tunnel junction as claimed in claim 1, wherein the at least one first segment has a relatively higher potential, and the at least one second segment has a relatively lower potential.

4. The magnetic tunnel junction as claimed in claim 1, wherein the pinned layer has a first magnetization direction extending vertically and the free layer has a second magnetization direction being one of the same as and opposite to the first magnetization direction.

5. The magnetic tunnel junction as claimed in claim 1, wherein the pinned layer has a first magnetization direction extending laterally, and the free layer has a second magnetization direction being one of the same as and opposite to the first magnetization direction.

6. A magnetic tunnel junction, comprising:
   a pinned layer;
   a free layer; and
   a first graphene layer having a plurality of segmented potentials and disposed between the pinned layer and the free layer.

7. The magnetic tunnel junction as claimed in claim 6, wherein the pinned layer is a second graphene layer including thereon a first ferromagnetic material, the free layer is a third graphene layer including thereon a second ferromagnetic material, and the second graphene layer and the third graphene layer are integrally formed with the first graphene layer.

8. The magnetic tunnel junction as claimed in claim 7, wherein the first graphene layer is laterally connected to the pinned layer and the free layer.

9. The magnetic tunnel junction as claimed in claim 8, wherein the first graphene layer includes at least two cells, and the at least two cells are laterally connected to each other.

10. The magnetic tunnel junction as claimed in claim 9, wherein each of the at least two cells includes at least one first segment and at least one second segment, alternately connected to each other laterally, wherein the first segment has a relatively higher potential, and the second segment has a relatively lower potential.

11. The magnetic tunnel junction as claimed in claim 9, wherein each of the at least two cells includes at least one first segment and at least one second segment such that when the total number of the at least one first segment and the total number of the at least one second segment are both equal to 1, the at least one first segment and the at least one second segment are laterally connected, when the total number of the at least one first segment is no less than 2, all the first segments are laterally connected, and when the total number of the at least one second segment is no less than 2, all the second segments are laterally connected.

12. The magnetic tunnel junction as claimed in claim 9, thither comprising a buffer layer, wherein the buffer layer is disposed in a position being one selected from a group consisting of being located between the first graphene layer and the pinned layer, between the first graphene layer and the free layer, and between the at least two cells.

13. The magnetic tunnel junction as claimed in claim 6, wherein the pinned layer has a first magnetization direction extending vertically and the free layer has a second magnetization direction being one of the same as and opposite to the first magnetization direction.

14. The magnetic tunnel junction as claimed in claim 6, wherein the pinned layer has a first magnetization direction extending laterally, and the free layer has a second magnetization direction being one of the same as and opposite to the first magnetization direction.

15. A method for forming a magnetic tunnel junction, comprising steps of:
   providing a pinned layer;
   providing a free layer; and
   providing a graphene having a plurality of segmented potentials between the pinned layer and the free layer.

16. The method for forming a magnetic tunnel junction as claimed in claim 15, wherein the graphene is laterally connected to the pinned layer and the free layer.

17. The method for forming a magnetic tunnel junction as claimed in claim 16, wherein the graphene includes at least two cells, and the at least two cells are laterally connected to each other.

18. The method for forming a magnetic tunnel junction as claimed in claim 16, wherein each of the at least two cells includes at least one first segment and at least one second segment, alternately connected to each other laterally, wherein the first segment has a relatively higher potential, and the second segment has a relatively lower potential.

19. The method for forming a magnetic tunnel junction as claimed in claim 16, wherein the pinned layer has a first magnetization direction extending vertically and the free layer has a second magnetization direction being one of the same as and opposite to the first magnetization direction.

20. The method for forming a magnetic tunnel junction as claimed in claim 16, wherein the pinned layer has a first magnetization direction extending laterally, and the free layer has a second magnetization direction being one of the same as and opposite to the first magnetization direction.

\* \* \* \* \*